US012559855B2

(12) United States Patent
Yoshikawa et al.

(10) Patent No.: US 12,559,855 B2
(45) Date of Patent: Feb. 24, 2026

(54) COMPOSITE SUBSTRATE, METHOD FOR PRODUCING COMPOSITE SUBSTRATE, AND METHOD FOR PRODUCING GALLIUM OXIDE CRYSTAL FILM

(71) Applicant: NGK INSULATORS, LTD., Nagoya (JP)

(72) Inventors: Jun Yoshikawa, Nagoya (JP); Miho Maeda, Nagoya (JP); Hiroyuki Shibata, Okazaki (JP)

(73) Assignee: NGK INSULATORS, LTD., Nagoya (JP)

( * ) Notice: Subject to any disclaimer, the term of this patent is extended or adjusted under 35 U.S.C. 154(b) by 343 days.

(21) Appl. No.: 18/469,661

(22) Filed: Sep. 19, 2023

(65) Prior Publication Data

US 2024/0003043 A1 Jan. 4, 2024

Related U.S. Application Data

(63) Continuation of application No. PCT/JP2022/008148, filed on Feb. 28, 2022.

(30) Foreign Application Priority Data

Apr. 27, 2021 (JP) ................................. 2021-075004

(51) Int. Cl.
| | |
|---|---|
| *C30B 7/14* | (2006.01) |
| *C30B 29/16* | (2006.01) |
| *C30B 33/00* | (2006.01) |

(52) U.S. Cl.
CPC ................ *C30B 7/14* (2013.01); *C30B 29/16* (2013.01); *C30B 33/00* (2013.01)

(58) Field of Classification Search
CPC ............ C30B 7/14; C30B 29/16; C30B 33/00
See application file for complete search history.

(56) References Cited

U.S. PATENT DOCUMENTS

| | | | |
|---|---|---|---|
| 2019/0055667 A1* | 2/2019 | Oshima | ............... H01L 21/0262 |
| 2020/0027730 A1* | 1/2020 | Nagaoka | ................. C30B 25/18 |
| 2021/0408242 A1 | 12/2021 | Watanabe et al. | |
| 2022/0029022 A1 | 1/2022 | Watanabe et al. | |

(Continued)

FOREIGN PATENT DOCUMENTS

| | | |
|---|---|---|
| CN | 101993110 A | 3/2011 |
| CN | 107841785 A | 3/2018 |
| JP | 2013-28480 A | 2/2013 |

(Continued)

OTHER PUBLICATIONS

English Translation of the International Preliminary Report on Patentability, issued in corresponding International Application No. PCT/JP2022/008148, Date of Mailing Nov. 9, 2023 (6 pages).

(Continued)

*Primary Examiner* — Robert M Kunemund
(74) *Attorney, Agent, or Firm* — FLYNN THIEL, P.C.

(57) ABSTRACT

A composite substrate includes: a base substrate and an $\alpha$-$Ga_2O_3$ crystal film that is provided on the base substrate, has a thickness of 10 μm or more, and has at least one alkali metal element content of $1.2 \times 10^{15}$ atoms/cm$^3$ or more and $1.0 \times 10^{18}$ atoms/cm$^3$ or less.

10 Claims, 5 Drawing Sheets

(56)                References Cited

U.S. PATENT DOCUMENTS

2022/0162768  A1      5/2022  Yoshikawa et al.

FOREIGN PATENT DOCUMENTS

| | | | |
|---|---|---|---|
| JP | 2014-72533 | A | 4/2014 |
| JP | 2016-25256 | A | 2/2016 |
| JP | 2021-42120 | A | 3/2021 |
| WO | 2020/194763 | A1 | 10/2020 |
| WO | 2021/064803 | A1 | 4/2021 |
| WO | WO-2021090635 | A1 * | 5/2021  ............... C30B 7/10 |

OTHER PUBLICATIONS

International Search Report, with English translation, issued in corresponding International Application No. PCT/JP2022/008148, date of mailing Apr. 12, 2022 (7 pages).
Written Opinion of International Searching Authority issued in corresponding International Application No. PCT/JP2022/008148, date of mailing Apr. 12, 2022 (4 pages).

* cited by examiner

Carrier gas

COMPOSITE SUBSTRATE, METHOD FOR PRODUCING COMPOSITE SUBSTRATE, AND METHOD FOR PRODUCING GALLIUM OXIDE CRYSTAL FILM

CROSS-REFERENCE TO RELATED APPLICATIONS

This is a continuation of PCT/JP2022/008148, filed Feb. 28, 2022, which claims priority from Japanese Application No. 2021-075004, filed Apr. 27, 2021, the entire contents all of which are hereby incorporated by reference.

BACKGROUND OF THE INVENTION

1. Field of the Invention

The present invention relates to a composite substrate, a method for producing the composite substrate, and a method for producing a gallium oxide crystal film.

2. Description of the Related Art

Attention has been focused on the use of gallium oxide ($Ga_2O_3$) as a material for semiconductors. Gallium oxide is known to have five crystal forms: $\alpha$, $\beta$, $\gamma$, $\delta$, and $\epsilon$. Among these, $\alpha$-$Ga_2O_3$, which is a metastable phase, has been considered as a promising material for power semiconductors because it has a considerably large band gap (5.3 eV). For example, PTL 1 discloses a semiconductor device that includes a substrate having a corundum crystal structure, a semiconductor layer having a corundum crystal structure, and an insulation film having a corundum crystal structure. In PTL 1, an example in which an $\alpha$-$Ga_2O_3$ film is disposed on a sapphire substrate as a semiconductor layer is described. PTL 2 discloses a semiconductor device that includes an n-type semiconductor layer including a crystalline oxide semiconductor having a corundum structure, the crystalline oxide semiconductor serving as a principal component; a p-type semiconductor layer including an inorganic compound having a hexagonal crystal structure, the inorganic compound serving as a principal component; and an electrode. In Examples of PTL 2, it is disclosed that a diode is prepared by forming an $\alpha$-$Ga_2O_3$ film having a corundum structure, which is a metastable phase, as an n-type semiconductor layer and an $\alpha$-$Rh_2O_3$ film having a hexagonal crystal structure, which serves as a p-type semiconductor layer, on a c-plane sapphire substrate. Furthermore, it is considered that $\alpha$-$Ga_2O_3$ can also be applied to fluorescent materials.

CITATION LIST

Patent Literature

PTL1: JP2014-72533A
PTL2: JP2016-25256A

SUMMARY OF THE INVENTION

However, increasing the thickness of an $\alpha$-$Ga_2O_3$ crystal film frequently caused separation between the $\alpha$-$Ga_2O_3$ crystal film and a base substrate, such as a sapphire substrate, while the $\alpha$-$Ga_2O_3$ crystal film is grown on the base substrate, and caused a crack at the separated portion and the periphery thereof. It has therefore been desired to reduce the separation between the $\alpha$-$Ga_2O_3$ crystal film and the base substrate.

The present invention has been made to solve such problems and mainly aims to reduce separation between an $\alpha$-$Ga_2O_3$ crystal film and a base substrate.

As a result of extensive studies to solve the above problems, the present inventors have conceived of immersing an $\alpha$-$Cr_2O_3$ substrate as a base substrate in an aqueous solution containing Ga ions to achieve a supercritical state at a temperature of 390° C.; or more and at a pressure of 22.1 MPa or more. It has been found that an $\alpha$-$Ga_2O_3$ crystal film is formed on the surface of the base substrate in this method, and even increasing the thickness of the $\alpha$-$Ga_2O_3$ crystal film to 10 µm or more is less likely to cause separation between the $\alpha$-$Ga_2O_3$ crystal film and the base substrate. Furthermore, the present inventors have completed the present invention by finding that at least one alkali metal element content of the $\alpha$-$Ga_2O_3$ crystal film formed on the base substrate is in a predetermined range.

A composite substrate of the present invention includes: a base substrate and an $\alpha$-$Ga_2O_3$ crystal film that is provided on the base substrate, has a thickness of 10 µm or more, and has at least one alkali metal element content of $1.2 \times 10^{15}$ atoms/cm³ or more and $1.0 \times 10^{18}$ atoms/cm³ or less.

A method for producing a composite substrate according to the present invention is a method for producing the composite substrate, wherein the $\alpha$-$Ga_2O_3$ crystal film is formed on a surface of the base substrate by bringing the base substrate into a supercritical state at a temperature of 390° C. or more and at a pressure of 22.1 MPa or more while the base substrate is immersed in an aqueous solution containing Ga ions.

A method for producing a gallium oxide crystal film according to the present invention includes removing the base substrate from the composite substrate to prepare a free standing $\alpha$-$Ga_2O_3$ crystal film. A free-standing $\alpha$-$Ga_2O_3$ crystal film refers to a composite substrate from which a base substrate has been removed and may be transferred onto another substrate as long as the base substrate has been removed.

Alternatively, a method for producing a gallium oxide crystal film according to the present invention includes removing the base substrate from a composite substrate produced by the method for producing a composite substrate to prepare a free standing $\alpha$-$Ga_2O_3$ crystal film.

A composite substrate and a method for producing a composite substrate according to the present invention can provide a composite substrate in which separation between an $\alpha$-$Ga_2O_3$ crystal film and a base substrate is reduced. The reason for such an effect is probably that, for example, an $\alpha$-$Ga_2O_3$ crystal film contains at least one alkali metal element at an appropriate concentration. A method for producing a composite substrate according to the present invention is suitable for producing a composite substrate in which separation between an $\alpha$-$Ga_2O_3$ crystal film and a base substrate is reduced. In a method for producing a gallium oxide crystal film according to the present invention, a gallium oxide crystal film with fewer cracks can be produced by removing a base substrate from a composite substrate with fewer cracks in which separation between an $\alpha$-$Ga_2O_3$ crystal film and the base substrate is reduced and thereby obtaining a free-standing $\alpha$-$Ga_2O_3$ crystal film.

DETAILED DESCRIPTION OF THE INVENTION

Figure 1:
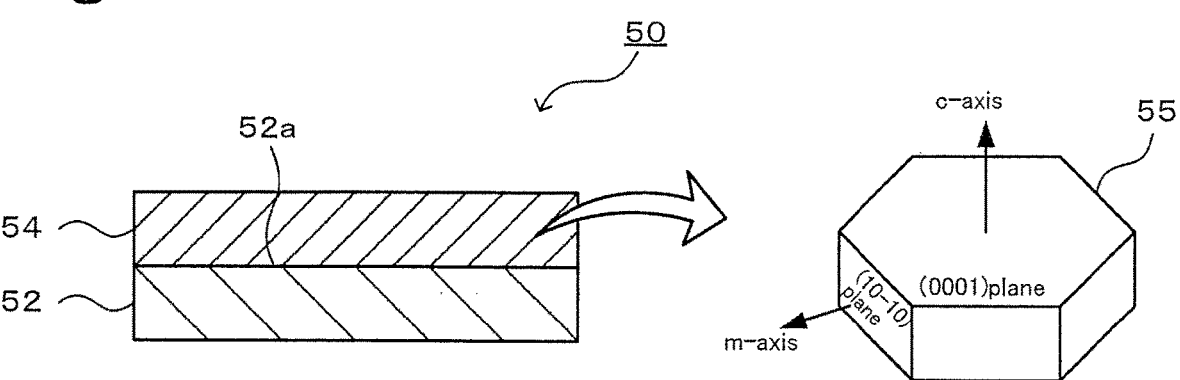
FIG. 1 is a cross-sectional view of a composite substrate 50.
Figure 2:
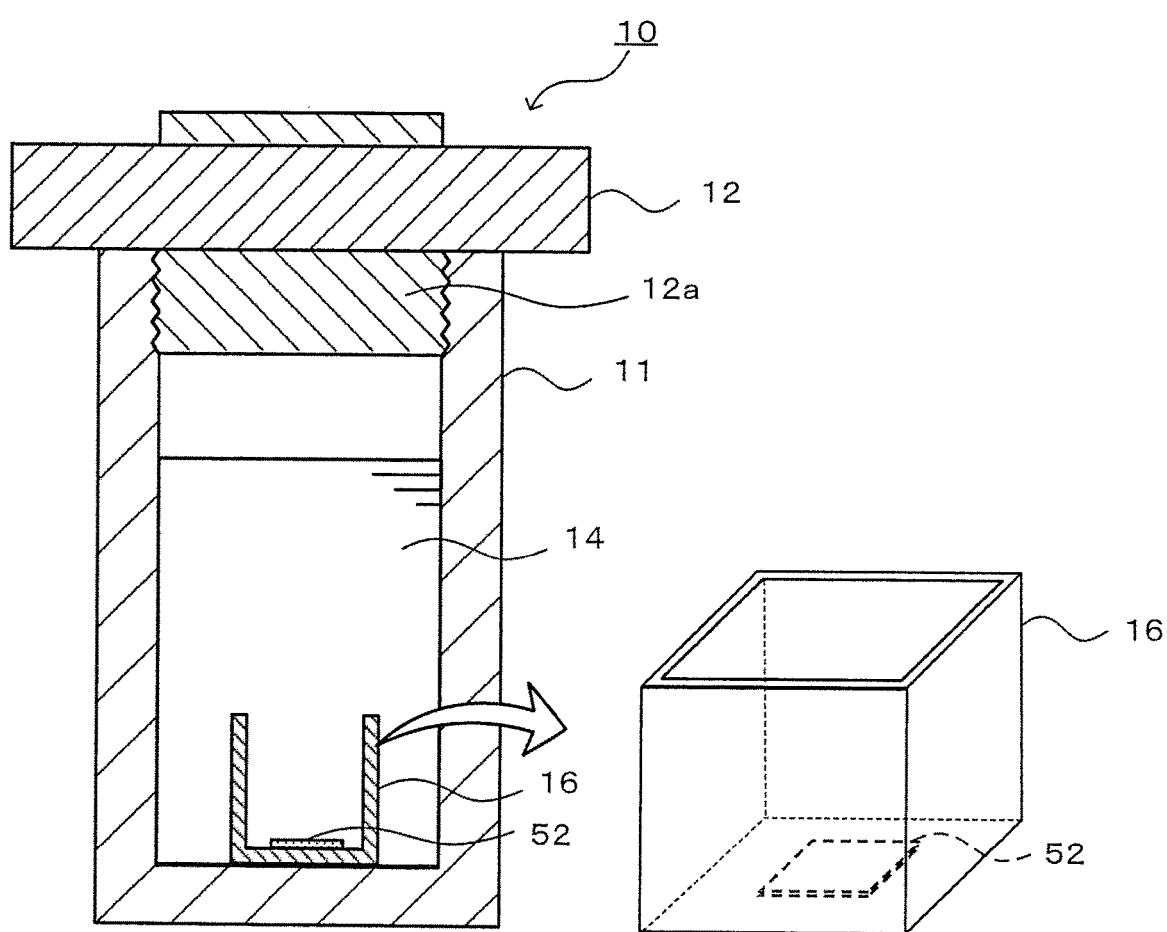
FIG. 2 is a longitudinal sectional view of a pressure-resistant vessel 10.
Figure 3:
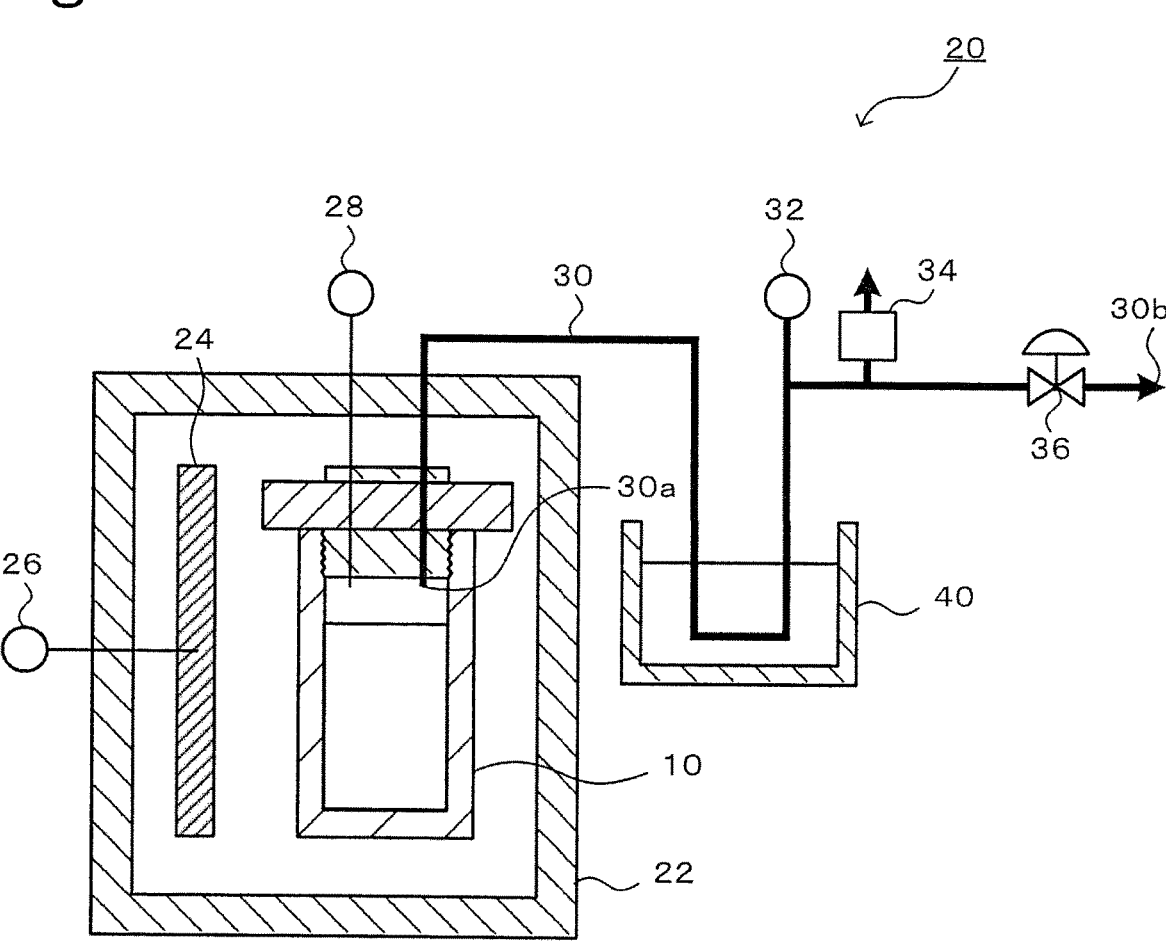
FIG. 3 is a schematic explanatory view of a hydrothermal synthesis system 20.

Preferred embodiments of the present invention will be described below with reference to the accompanying drawings. FIG. 1 is a cross-sectional view of a composite substrate 50. FIG. 2 is a longitudinal sectional view of a pressure-resistant vessel 10. FIG. 3 is a schematic explanatory view of a hydrothermal synthesis system 20.

[Composite Substrate]

The composite substrate 50 is a plate-like member and includes a base substrate 52 and an $\alpha$-$Ga_2O_3$ crystal film 54 on the base substrate 52. The composite substrate 50 has an area of, for example, 1 $mm^2$ or more, preferably 10 $mm^2$ or more.

The base substrate 52 is a substrate to be a seed crystal of the $\alpha$-$Ga_2O_3$ crystal film 54. The base substrate 52 is preferably a substrate with a corundum structure, particularly preferably a substrate (biaxially oriented substrate) oriented in two axes of a c-axis and an axis perpendicular to the c-axis (such as an a-axis or an m-axis). The biaxially oriented substrate may be a polycrystal, a mosaic crystal (a group of crystals slightly shifted in crystal orientation), or a single crystal. The base substrate 52 may be c-axis oriented at an off-angle of 10 degrees or less in the direction normal to the substrate. Another substrate may be provided on the surface of the base substrate 52 opposite to the surface (a formation surface 52a) on which the $\alpha$-$Ga_2O_3$ crystal film 54 is formed.

The base substrate 52 is an $\alpha$-$Cr_2O_3$ substrate. The $\alpha$-$Cr_2O_3$ substrate may be, for example, a substrate made of $\alpha$-$Cr_2O_3$ containing no components other than incidental impurities (referred to as a high-purity $\alpha$-$Cr_2O_3$ substrate) or a substrate containing $\alpha$-$Cr_2O_3$ and containing metal elements and/or metalloid elements other than Cr, such as Ti, Fe, Al, Mg, Si, and Ca, in a total amount not exceeding the number of moles of Cr. These metal elements and/or metalloid elements may be solved in $\alpha$-$Cr_2O_3$ or may be solved in $\alpha$-$Cr_2O_3$ as a crystalline phase of an oxide crystal or the like (for example, $\alpha$-$Al_2O_3$). Such a solid solution is also referred to as an $\alpha$-$Cr_2O_3$ solid solution. The $\alpha$-$Cr_2O_3$ substrate is particularly preferably a high-purity $\alpha$-$Cr_2O_3$ substrate or an $\alpha$-$Cr_2O_3$ solid solution substrate containing at least one of Fe and Ti.

The $\alpha$-$Ga_2O_3$ crystal film 54 is formed on one surface (the formation surface 52a) of the base substrate 52 and has a thickness of 10 $\mu$m or more. An $\alpha$-$Ga_2O_3$ crystal 55 constituting the $\alpha$-$Ga_2O_3$ crystal film 54 is a crystal with a corundum structure. The $\alpha$-$Ga_2O_3$ crystal film 54 is preferably oriented in two axes of a c-axis and an axis perpendicular to the c-axis (biaxial orientation). The $\alpha$-$Ga_2O_3$ crystal film 54 may be a polycrystal, a mosaic crystal, or a single crystal. The $\alpha$-$Ga_2O_3$ crystal film 54 may be c-axis oriented at an off-angle of 10 degrees or less in the direction normal to the substrate. The $\alpha$-$Ga_2O_3$ crystal film 54 has at least one alkali metal element content of $1.2\times10^{15}$ to $1.0\times10^{18}$ atoms/$cm^3$. The alkali metal element may be Li, Na, or K. The Li content, the Na content, and the K content may be $1.2\times10^{15}$ atoms/$cm^3$ or more and $1.0\times10^{18}$ atoms/$cm^3$ or less. The crystal orientation differences between the $\alpha$-$Ga_2O_3$ crystal film 54 and the base substrate 52 with respect to their (0001) plane and (10-10) plane may be both 0.4 degrees or less. The $\alpha$-$Ga_2O_3$ crystal film 54 may have an X-ray rocking curve (XRC) half-width of 2000 arcsec or less on a (006) plane and a (104) plane. At least one of the Cr content and the Ni content of $\alpha$-$Ga_2O_3$ crystal film 54 may range from $2.0\times10^{15}$ to $1.0\times10^{17}$ atoms/$cm^3$. Each of the Li content, the Na content, and the K content of the $\alpha$-$Ga_2O_3$ crystal film 54 may range from $1.2\times10^{15}$ to $1.0\times10^{18}$ atoms/$cm^3$. The $\alpha$-$Ga_2O_3$ crystal film 54 may contain a dopant. Examples of the dopant include group 14 elements, such as carbon (C), silicon (Si), germanium (Ge), tin (Sn), and lead (Pb). The electrical conductivity of the $\alpha$-$Ga_2O_3$ crystal film 54 can be controlled using a dopant in the $\alpha$-$Ga_2O_3$ crystal film 54.

[Method For Producing Composite Substrate]

Next, a method for producing the composite substrate 50 is described. In the method for producing the composite substrate 50, the $\alpha$-$Ga_2O_3$ crystal film 54 is formed on a surface of the base substrate 52 by bringing the base substrate 52 into a supercritical state at a temperature of 390° C. or more (preferably 400° C. or more) and at a pressure of 22.1 MPa or more while the base substrate 52 is immersed in an aqueous solution containing Ga ions.

The aqueous solution containing Ga ions may be aqueous gallium halide, aqueous gallium nitrate, aqueous gallium sulfate, and aqueous gallium hydroxide. The gallium halide may be gallium chloride, gallium bromide, or gallium iodide. The aqueous solution containing Ga ions may contain an alkali metal element (alkali metal ion). The alkali metal element may be Li, Na, or K. The aqueous solution containing Ga ions is preferably adjusted to a pH of 9.0 to 11.0 (more preferably 9.5 to 10.5) with a pH adjuster. The pH adjuster may be an aqueous solution of an alkali metal hydroxide (for example, aqueous KOH) or an aqueous solution containing ammonium ions (for example, aqueous ammonium). The concentration of Ga ions in the aqueous solution containing Ga ions is, but not limited to, for example, 0.1 M or more and 10 M or less.

A work-affected layer on at least one surface (the surface to be the formation surface 52a) of the base substrate 52 to be immersed in the aqueous solution containing Ga ions is preferably removed by chemical mechanical polishing (CMP), annealing, etching, reactive ion etching (RIE), or the like. When the base substrate 52 is immersed in the aqueous solution containing Ga ions, if the surface from which a work-affected layer has been removed is placed in contact with the aqueous solution containing Ga ions, the $\alpha$-$Ga_2O_3$ crystal film 54 is formed on the surface from which the work-affected layer has been removed. When the base substrate 52 is immersed in the aqueous solution containing Ga ions, the base substrate 52 mounted or fixed on a jig made of Pt or the like may be immersed.

To bring the aqueous solution containing Ga ions into a supercritical state at a temperature of 390° C. or more and at a pressure of 22.1 MPa or more, it is preferable to place the aqueous solution containing Ga ions in a pressure-resistant vessel and adjust the temperature to 390° C. or more and the pressure to 22.1 MPa or more. The pressure depends on the internal volume of the pressure-resistant vessel, the amount of the aqueous solution to be put into the pressure-resistant vessel, the internal temperature of the pressure-resistant vessel, and the setting of a pressure-regulating valve. The reaction time may be, but is not limited to, for example, 0.5 hours or more and 100 hours or less. After completion of the reaction, the internal temperature of the pressure-resistant vessel is decreased, and the base substrate 52 (the composite substrate 50) on which the α-Ga$_2$O$_3$ crystal film 54 is deposited is removed from the pressure-resistant vessel.

To form the α-Ga$_2$O$_3$ crystal film 54 containing a dopant, the aqueous solution containing Ga ions may contain ions corresponding to the dopant. Examples of the dopant include group 14 elements, such as carbon (C), silicon (Si), germanium (Ge), tin (Sn), and lead (Pb). The electrical conductivity of the α-Ga$_2$O$_3$ crystal film 54 can be controlled using a dopant in the α-Ga$_2$O$_3$ crystal film 54.

FIG. 2 illustrates an example of the pressure-resistant vessel. The pressure-resistant vessel 10 of FIG. 2 is made of stainless steel, and a lid 12 with a protrusion 12*a* provided with a male screw is screwed into a female screw provided in an opening of a bottomed cylindrical vessel main body 11. The pressure-resistant vessel 10 preferably has an internal volume of 50 mL or more. The vessel main body 11 of the pressure-resistant vessel 10 contains an aqueous solution 14 containing Ga ions. The aqueous solution 14 is preferably adjusted to a pH of 9.0 to 11.0 (more preferably a pH of 9.5 to 10.5). The base substrate 52 disposed on the bottom of a box-like jig 16 made of Pt is immersed in the aqueous solution 14. The base substrate 52 is disposed such that the surface from which the work-affected layer is removed faces up.

FIG. 3 is a schematic explanatory view of the hydrothermal synthesis system 20. In the hydrothermal synthesis system 20, the pressure-resistant vessel 10 is placed in an electric furnace housing 22. A heater 24 and an in-furnace temperature measuring thermocouple 26 are mounted inside the electric furnace housing 22. A pressure-resistant vessel thermocouple 28 for measuring the internal temperature of the pressure-resistant vessel 10 is attached to the pressure-resistant vessel 10. The electric power supplied to the heater 24 is controlled so that the in-furnace temperature measured with the in-furnace temperature measuring thermocouple 26 can reach the set temperature. A pipe 30 is connected to the pressure-resistant vessel 10. One end 30*a* of the pipe 30 is disposed inside the pressure-resistant vessel 10, and the other end 30*b* of the pipe 30 is disposed in the atmosphere. The pipe 30 is cooled by cooling water in a cooling water tank 40. A pressure gauge 32, a safety valve 34, and a pressure-regulating valve 36 are disposed between the cooling water tank 40 and the other end 30*b* of the pipe 30. The pressure-resistant vessel 10 is entirely heated by the heater 24 so that the internal temperature of the pressure-resistant vessel 10 can be 390° C. or more and the internal pressure of the pressure-resistant vessel 10 can be 22.1 MPa or more. The internal pressure of the pressure-resistant vessel 10 depends on the internal volume of the pressure-resistant vessel 10, the amount of the aqueous solution 14 to be put into the pressure-resistant vessel 10, the internal temperature of the vessel, and the setting of the pressure-regulating valve 36. Thus, the amount of the aqueous solution 14 to be put into the pressure-resistant vessel 10 may be adjusted so that the internal pressure of the vessel can reach 22.1 MPa or more when the internal temperature of the vessel is 390° C. or more. This state is maintained for a predetermined time, and the internal temperature of the pressure-resistant vessel

10 is then decreased to room temperature. The base substrate 52 (the composite substrate 50) on which the α-Ga$_2$O$_3$ crystal film 54 is deposited is then removed from the pressure-resistant vessel 10, is rinsed with pure water, and is then dried in a dryer.

[Method for Producing Gallium Oxide Crystal Film]

Next, a method for producing a gallium oxide crystal film will be described. In one example of the method for producing a gallium oxide crystal film, the base substrate 52 is removed from the composite substrate 50 to prepare a free-standing α-Ga$_2$O$_3$ crystal film 54. A method for removing the base substrate 52 from the composite substrate 50 may be grinding, polishing, laser lift-off, etching of a substrate portion with an acid or an alkali, reactive ion etching (RIE), or the like. The base substrate 52 can be removed from the composite substrate 50 to prepare the free-standing α-Ga$_2$O$_3$ crystal film 54. The α-Ga$_2$O$_3$ crystal film 54 may be transferred onto another substrate as long as the base substrate 52 has been removed.

The composite substrate 50 and the method for producing the composite substrate 50 described above can provide a composite substrate in which separation between the α-Ga$_2$O$_3$ crystal film 54 and the base substrate 52 is reduced. The reason for such an effect is probably that, for example, the α-Ga$_2$O$_3$ crystal film 54 contains at least one alkali metal element at an appropriate concentration. Furthermore, it is expected that at least one alkali metal element contained in the α-Ga$_2$O$_3$ crystal film 54 at an appropriate concentration decreases a different phase of β-Ga$_2$O$_3$ or the like and stably generates an α-Ga$_2$O$_3$ crystal. The method for producing the composite substrate 50 is suitable for producing the composite substrate 50. In the method for producing a gallium oxide crystal film, the base substrate 52 is removed from the composite substrate 50 with fewer cracks in which separation between the α-Ga$_2$O$_3$ crystal film 54 and the base substrate 52 is reduced, so that the α-Ga$_2$O$_3$ crystal film 54 with fewer cracks is prepared as a free-standing film. In the composite substrate 50, the separation area between the α-Ga$_2$O$_3$ crystal film 54 and the base substrate 52 may constitute, for example, 10% or less, preferably 3% or less, of the formation surface 52*a*.

In the composite substrate 50, the α-Ga$_2$O$_3$ crystal film 54 has a thickness of 10 μm or more, and a thick self-standing α-Ga$_2$O$_3$ crystal film 54 with a thickness of 10 μm or more can be obtained by removing the base substrate 52. Such an α-Ga$_2$O$_3$ crystal film 54 is suitable for use in a power semiconductor with a vertical structure that requires an electric current to flow in the thickness direction. The thickness of the α-Ga$_2$O$_3$ crystal film 54 may be appropriately adjusted according to the intended use and may be 100 μm or less, for example. The thickness of the α-Ga$_2$O$_3$ crystal film 54 can be adjusted, for example, by changing the amount and concentration of Ga to be used and the time of hydrothermal synthesis.

Furthermore, in the composite substrate 50, the base substrate 52 is an α-Cr$_2$O$_3$ substrate, and the α-Ga$_2$O$_3$ crystal film is therefore formed in an appropriate state. This further reduces the separation between the α-Ga$_2$O$_3$ crystal film 54 and the base substrate 52.

Furthermore, in the composite substrate 50, the crystal orientation differences between the α-Ga$_2$O$_3$ crystal film 54 and the base substrate 52 with respect to their (0001) plane and the (10-10) plane are both preferably 0.4 degrees or less. In other words, the α-Ga$_2$O$_3$ crystal film 54 preferably has almost the same crystal orientation as that of the base substrate 52. The α-Ga$_2$O$_3$ crystal film 54 and the base substrate 52 with almost the same crystal orientations are less likely to cause strain therebetween and are less likely to separate from each other. The crystal orientation differences between the $\alpha$-$Ga_2O_3$ crystal film 54 and the base substrate 52 with respect to their (0001) plane and the (10-10) plane are both more preferably 0.3 degrees or less, still more preferably 0.2 degrees or less, still more preferably 0.1 degrees or less.

Furthermore, when an $\alpha$-$Ga_2O_3$ crystal is used for a power semiconductor or the like that is required to have a high withstand voltage, the dielectric breakdown field characteristics depend on the crystal quality, and high crystal quality is therefore required. Thus, in the composite substrate 50, the $\alpha$-$Ga_2O_3$ crystal film 54 preferably has an X-ray rocking curve half-width of 2000 arcsec or less, in other words, sufficiently high crystallinity (crystal quality), on the (006) plane and the (104) plane. The X-ray rocking curve half-width on the (006) plane is preferably 1600 arcsec or less and may be 1000 arcsec or less or 100 arcsec or less. The X-ray rocking curve half-width on the (104) plane is preferably 1900 arcsec or less and may be 1000 arcsec or less or 400 arcsec or less. The X-ray rocking curve half-width on the (006) plane and the (104) plane may be 50 arcsec or more.

In the composite substrate 50, at least one of the Cr content and the Ni content of the $\alpha$-$Ga_2O_3$ crystal film 54 preferably ranges from $2.0 \times 10^{15}$ to $1.0 \times 10^{17}$ atoms/cm³. This further reduces the separation between the $\alpha$-$Ga_2O_3$ crystal film 54 and the base substrate 52. The Cr content and the Ni content preferably range from $2.0 \times 10^{15}$ to $1.0 \times 10^{17}$ atoms/cm³. The sum total of the Cr content and the Ni content is preferably $1.6 \times 10^{17}$ atoms/cm³ or less, more preferably $5.0 \times 10^{16}$ atoms/cm³ or less.

Furthermore, in the composite substrate 50, the Li content, the Na content, and the K content of the $\alpha$-$Ga_2O_3$ crystal film 54 preferably range from $1.2 \times 10^{15}$ to $1.0 \times 10^{18}$ atoms/cm³. The sum total of the Li content, the Na content, and the K content preferably ranges from $1.2 \times 10^{15}$ to $1.2 \times 10^{18}$ atoms/cm³.

The present invention is not limited to the above-described embodiment, and can be carried out by various modes as long as they belong to the technical scope of the invention.

For example, although the base substrate 52 is an $\alpha$-$Cr_2O_3$ substrate in the embodiment described above, the base substrate 52 may be a sapphire substrate, an $\alpha$-$Fe_2O_3$ substrate, an $\alpha$-$Ga_2O_3$ substrate, or the like. Depending on the type of the base substrate 52, $\alpha$-$Ga_2O_3$ crystals may be formed in the form of particles instead of a film form, or a different phase of $\beta$-$Ga_2O_3$ crystals or the like may be easily formed. The base substrate 52 is preferably an $\alpha$-$Cr_2O_3$ substrate to easily form $\alpha$-$Ga_2O_3$ crystals in a film form and to reduce the formation of a different phase. In particular, the base substrate 52 is preferably an $\alpha$-$Cr_2O_3$ solid solution substrate to increase the crystallinity of the $\alpha$-$Ga_2O_3$ crystal film 54 and to decrease the crystal orientation difference between the $\alpha$-$Ga_2O_3$ crystal film 54 and the base substrate 52.

EXAMPLES

Examples of the present invention are described below. Note that the present invention is not limited by Examples below.

Example 1

1. Preparation of Base Substrate

A commercial c-plane (no off-angle) $\alpha$-$Cr_2O_3$ single-crystal substrate, which is a high-purity $\alpha$-$Cr_2O_3$ substrate, was cut into an approximately 4-mm square (square 4 mm). After mirror-polishing both surfaces with diamond slurry, one surface was further finished by CMP treatment. The surface finished by the CMP treatment is also referred to as a base CMP surface, and the other surface is also referred to as a base non-CMP surface.

2. Hydrothermal Synthesis

A 0.1 M aqueous solution of gallium nitrate octahydrate (manufactured by Kishida Chemical Co., Ltd.) was prepared, and the pH was adjusted to 10.0 using 1 M aqueous KOH as a pH adjuster to prepare a raw material solution. The 4-mm square c-plane $\alpha$-$Cr_2O_3$ single crystal substrate (base substrate 52) was then placed with the base CMP surface facing up in a jig 16 with a height of 10 mm, a width of 10 mm, and a depth of 10 mm made of a Pt foil with a thickness of 50 in a pressure-resistant vessel 10 (inner diameter: 19 mm, internal volume: 50 mL) made of SUS 316 illustrated in FIG. 2. The pressure-resistant vessel 10 was then filled with 45 mL of the raw material solution and was sealed. The pressure-resistant vessel 10 was then placed in the electric furnace housing 22 of the hydrothermal synthesis system 20. The pressure-regulating valve 36 was set in advance so that the internal pressure of the pressure-resistant vessel 10 could be 30.0 MPa. The pressure-resistant vessel 10 was then entirely heated to an internal temperature of 410° C. with the heater 24 of the electric furnace housing 22. The internal pressure of the pressure-resistant vessel 10 was 30.0 MPa. This state was maintained for 24 hours. After the internal temperature of the pressure-resistant vessel 10 was decreased to room temperature, the substrate (composite substrate) thus prepared was taken out from the pressure-resistant vessel 10, was rinsed with pure water, and was dried in a dryer. In this composite substrate, a crystal film was formed on the base CMP surface.

3. Removal of Base Substrate

A surface of the composite substrate on the base side (base non-CMP surface) prepared in 2. was attached to a polishing plate with wax, and the surface of the crystal film was polished with diamond slurry and was finished to be smooth by CMP (crystal film CMP surface). The composite substrate was removed from the polishing plate, and a sapphire substrate was bonded with wax to the crystal film CMP surface of the composite substrate to prepare a joined body. The sapphire surface of the joined body was attached to a polishing plate with wax, and the base substrate ($Cr_2O_3$ portion) was ground and removed with a grinder using #1000 and #6000 whetstones. Thus, a gallium oxide crystal film transferred onto the sapphire substrate was prepared. The sapphire substrate is attached to the gallium oxide crystal film with wax and can be easily removed. Thus, a free-standing gallium oxide crystal film is prepared.

4. Evaluation (1) Crystalline Phase

An XRD profile of the crystal produced on the base CMP surface in the above 2. was obtained with an XRD apparatus (RINT-TTR III manufactured by Rigaku Corporation) under the following conditions. As a result, the main phase of the formed crystal film was identified as $\alpha$-$Ga_2O_3$.

X-ray tube Cu target
Tube voltage 50 kV
Tube current 300 mA
$2\theta/\theta$ method
$2\theta$ range 10 degrees to 80 degrees (2) Presence or Absence of Separation The composite substrate prepared in the above 2. was visually inspected for the presence or absence of separation between the base substrate and the $\alpha$-$Ga_2O_3$ crystal film. Although the separation was observed only slightly (3% or less) on the outer periphery of the composite substrate, extensive separation was not observed.

(3) Microstructure Observation

Figure 4:
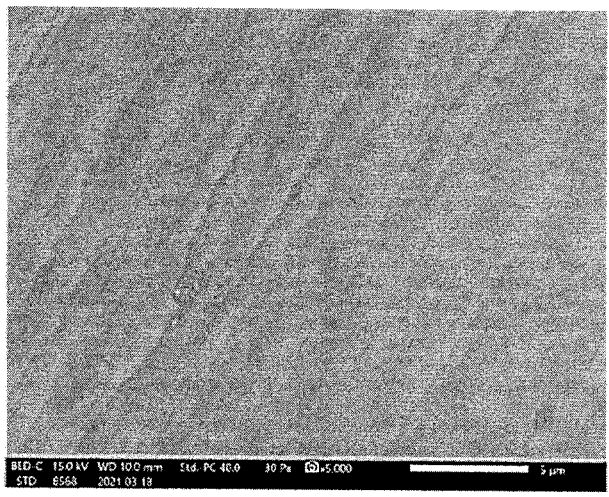
FIG. 4 is a surface SEM image of a composite substrate prepared in Example 1.
Figure 5:
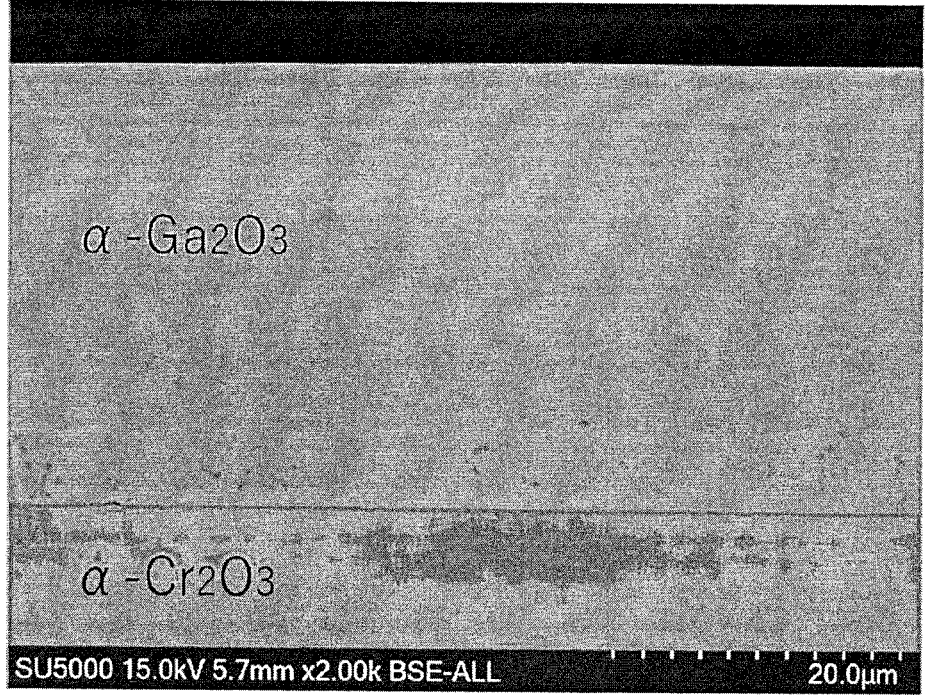
FIG. 5 is a cross-sectional SEM image of the composite substrate prepared in Example 1.

As a result of observing the surface ($\alpha$-$Ga_2O_3$ crystal film surface) of the composite substrate prepared in the above 2. with a scanning electron microscope (SEM, JSM-IT500 manufactured by JEOL Ltd.), a crystal film as shown in FIG. 4 was observed. After the substrate was embedded in a resin, a cross-section was prepared with a microcutter, and a cross-sectional observation sample was prepared with a cross-section polisher (IB-19500CP manufactured by JEOL Ltd.). A backscattered electron image of the cross-section was taken with a scanning electron microscope (SU-5000 manufactured by Hitachi High-Technologies Corporation). As shown in FIG. 5, due to the contrast difference, the $\alpha$-$Cr_2O_3$ (base substrate) of the composite substrate and the $\alpha$-$Ga_2O_3$ crystal film can be easily distinguished from each other. The thickness of the $\alpha$-$Ga_2O_3$ crystal film was measured in the cross-sectional SEM image. Table 1 shows the results. As can be seen from FIGS. 4 and 5, few fine holes were observed in the crystal film formed on the base substrate.

(4) X-Ray Rocking Curve Half-Width

An XRC of the (006) plane and the (104) plane of the crystal formed on the base CMP surface in the above 2. was measured with an XRD apparatus (D8-DISCOVER manufactured by Bruker-AXS). More specifically, the axes were determined by adjusting $2\theta$, $\omega$, $\chi$, and $\varphi$ so that a peak of the (006) plane or the (104) plane of $\alpha$-$Ga_2O_3$ could appear. The conditions were as follows: a tube voltage of 40 kV, a tube current of 40 mA, an anti-scattering slit of 3 mm, $\omega$=20.0 to 20.4 degrees for the (006) plane measurement, $\omega$=16.5 to 17.5 degrees for the (104) plane measurement, an $\omega$ step width of 0.001 degrees, and a counting time of 0.5 seconds. A CuK$\alpha$ line converted with a Ge (022) asymmetric reflection monochromator to parallel monochromatic light was used as an X-ray source. A half-width of an XRC profile of $\alpha$-$Ga_2O_3$ thus obtained was determined by using XRD analysis software ("LEPTOS" Ver. 4.03 available from Bruker-AXS) for smoothing the profile and then performing a peak search. Table 1 shows the results.

(5) Electron Backscatter Diffraction (EBSD)

The cross-sectional observation sample prepared in the above (3) was subjected to EBSD measurement with a scanning electron microscope (SU-5000 manufactured by Hitachi High-Technologies Corporation) combined with EBSD (Nordlys Nano manufactured by Oxford Instruments). Inverse pole figure orientation mapping thus obtained showed that the $\alpha$-$Ga_2O_3$ crystal film was a biaxially oriented layer that was c-axis oriented in the direction normal to the substrate and that was also oriented in the substrate in-plane direction. Furthermore, tilt angle distributions of $\alpha$-$Ga_2O_3$ and $\alpha$-$Cr_2O_3$ with respect to the (0001) orientation and the (10-10) orientation were analyzed in a crystal orientation mapping thus obtained to calculate a difference in peak top position of the angle distributions. More specifically, first, after the Class width of a histogram of a tilt angle distribution displayed by an analysis program Legend was set to 0.010, a crystal orientation mapping image measured in the field of view including both the $\alpha$-$Ga_2O_3$ film and the $\alpha$-$Cr_2O_3$ substrate was subjected to axis alignment using an analysis program Virtual Chamber such that the peak top position of the tilt angle distribution in the (0001) orientation of the $\alpha$-$Ga_2O_3$ film portion ranged from 10 to 11 degrees and such that the peak top position of the tilt angle distribution in the (10-10) orientation of the $\alpha$-$Ga_2O_3$ film portion ranged from 10 to 11 degrees. The angle at the peak top position of the tilt angle distribution in the (0001) orientation of the $\alpha$-$Ga_2O_3$ film portion was defined as c1 [degrees] (10<c1<11), and the angle at the peak top position of the tilt angle distribution in the (10-10) orientation of the $\alpha$-$Ga_2O_3$ film portion was defined as a1 [degrees] (10<a1<11). Subsequently, while the axis alignment state was maintained, the angle c2 [degrees] at the peak top position of the tilt angle distribution in the (0001) orientation of the base substrate ($\alpha$-$Cr_2O_3$) portion was determined to calculate the (0001) orientation difference |c1-c2|[degrees] between the base substrate and the $\alpha$-$Ga_2O_3$ film. Likewise, the angle a2 [degrees] at the peak top position of the tilt angle distribution in the (10-10) orientation of the base substrate ($\alpha$-$Cr_2O_3$) portion was determined to calculate the (10-10) orientation difference |a1-a2|[degrees] between the base substrate and the $\alpha$-$Ga_2O_3$ film. Table 1 shows the results. This result showed that the orientation difference between the base substrate and the $\alpha$-$Ga_2O_3$ film in Example 1 was 0.10 degrees in the (0001) orientation and 0.13 degrees in the (10-10) orientation, indicating that the $\alpha$-$Ga_2O_3$ film had almost the same crystal orientation as the base substrate. In the above description, the crystal orientation [0001] of the (0001) plane is defined as the (0001) orientation, and the crystal orientation [10-10] of the (10-10) plane is defined as the (10-10) orientation. The conditions for the EBSD measurement were described below.

<EBSD Measurement Conditions>

Accelerating voltage: 15 kV

Spot intensity: 70

Working distance: 22.5 mm

Step size: 0.4 $\mu$m

Sample tilt angle: 70 degrees

Measurement Program: AZtec

Analysis Program: OXFORD HKL CHANNEL5

(6) Composition Analysis

A secondary ion mass spectrometer (SIMS) was used for the composition analysis (D-SIMS analysis) of the $\alpha$-$Ga_2O_3$ crystal film on the surface of the composite substrate prepared in the above 2. The conditions for the D-SIMS analysis were described below.

<D-SIMS Analysis Conditions>

Apparatus: IMS-7f manufactured by CAMECA

Primary ion species: $O_2^+$

Primary ion accelerating voltage: 8.0 kV

Each ion content was converted to the unit "atoms/$cm^3$" using a $Ga_2O_3$ standard sample, and a depth profile was prepared. Each ion content was determined as an average value at a depth of 1 to 2 $\mu$m from the surface. Table 1 shows the results.

Example 2

A sample was prepared and examined in the same manner as in Example 1 except that, in the preparation of a raw material solution, aqueous 1 M LiOH was used as a pH adjuster, the pH of the 0.1 M aqueous solution of gallium nitrate octahydrate was adjusted to 10.5, and the internal temperature of the pressure-resistant vessel 10 was adjusted to 400° C. The main phase of a crystal film formed on the base substrate was α-Ga₂O₃. Table 1 shows various evaluation results.

Example 3

A sample was prepared and examined in the same manner as in Example 1 except that, in the preparation of a raw material solution, aqueous 1 M NaOH was used as a pH adjuster, and the pH of the 0.1 M aqueous solution of gallium nitrate octahydrate was adjusted to 9.5. The main phase of a crystal film formed on the base substrate was α-Ga₂O₃. Table 1 shows various evaluation results.

Example 4

Figure 6:
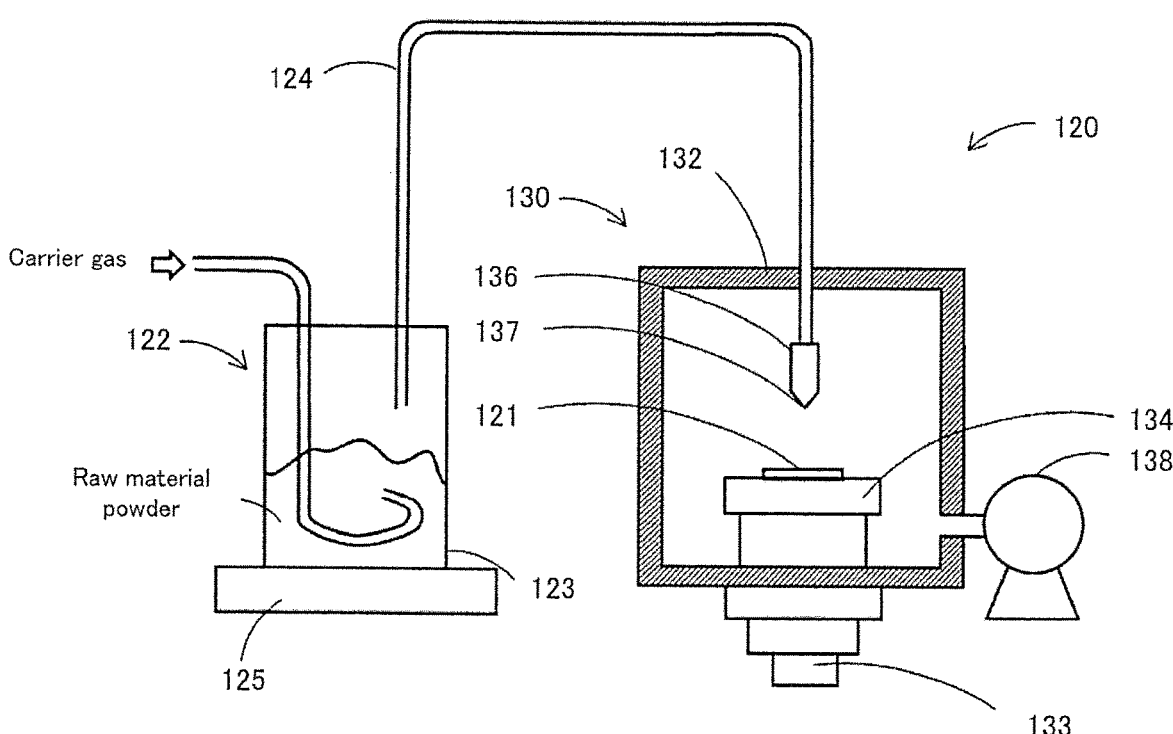
FIG. 6 is a schematic cross-sectional view of the structure of an AD apparatus 120.

A base substrate that was an α-Cr₂O₃ solid solution substrate was prepared as described below. A mixed powder prepared by adding 5 parts by weight of a TiO₂ powder and 16 parts by weight of an Fe₂O₃ powder to 100 parts by weight of a Cr₂O₃ powder and wet-mixing the powders was used as a raw material powder to form an aerosol deposition (AD) film with an AD apparatus 120 illustrated in FIG. 6 on a sapphire substrate (diameter: 50.8 mm (2 inches), thickness: 1.0 mm, c-plane, off-angle: 0.5 degrees). The AD apparatus 120 illustrated in FIG. 6 is configured to be used for the AD method for spraying a substrate with a raw material powder in an atmosphere with a pressure lower than the atmospheric pressure. The film-forming apparatus 120 includes an aerosol-generating unit 122 for generating an aerosol of a raw material powder containing a raw material component and a film-forming unit 130 for spraying a sapphire substrate 121 with the raw material powder to form a film containing the raw material component. The aerosol-generating unit 122 includes an aerosol-generating chamber 123 for storing the raw material powder and generating the aerosol in response to the supply of a carrier gas from a gas cylinder (not shown), a raw material supply pipe 124 for supplying the generated aerosol to the film-forming unit 130, and a vibrator 125 for applying vibration to the aerosol-generating chamber 123 and the aerosol in the aerosol-generating chamber 123 at a frequency of 10 to 100 Hz. The film-forming unit 130 includes a film-forming chamber 132 for spraying the sapphire substrate 121 with the aerosol, a substrate holder 134 that is disposed inside the film-forming chamber 132 and fixes the sapphire substrate 121, and an X-Y stage 133 for moving the substrate holder 134 in the X-axis and Y-axis directions. The film-forming unit 130 includes a spray nozzle 136 that has a slit 137 at the tip thereof and that sprays the sapphire substrate 121 with the aerosol, and a vacuum pump 138 for reducing the pressure of the film-forming chamber 132.

The AD film-forming conditions were as follows: the carrier gas was Ar, and the nozzle was a ceramic nozzle having a slit with a long side of 5 mm and a short side of 0.3 mm. The nozzle scanning conditions were as follows: the nozzle was moved at a scanning speed of 0.5 mm/s by 55 mm in the direction perpendicular to the long side of the slit and in the forward direction, 5 mm in the long side direction of the slit, 55 mm in the direction perpendicular to the long side of the slit and in the backward direction, and 5 mm in the long side direction of the slit and in the direction opposite to the initial position; after these movements were repeated and the nozzle was moved 55 mm from the initial position in the long side direction of the slit, the nozzle was moved in the direction opposite to the previous direction to return to the initial position; this cycle was repeated 400 times. In one cycle of film formation at room temperature, the set pressure of the carrier gas was adjusted to 0.07 MPa, the flow rate to 9 L/min, and the internal pressure of the chamber to 100 Pa or less. The AD film thus formed had a thickness of approximately 100 μm.

The sapphire substrate on which the AD film was formed was taken out from the AD apparatus and was annealed at 1680° C. for 4 hours in a nitrogen atmosphere. The substrate thus prepared was fixed to a ceramic surface plate, and the surface on which the AD film was formed was ground with a whetstone to #2000 to flatten the substrate surface. The substrate surface was then smoothed by lapping with diamond abrasive grains. The size of the abrasive grains was gradually reduced from 3 μm to 0.5 μm to increase the flatness. After the substrate was cut to a size of square 4 mm with a dicer, mirror finishing was performed by chemical mechanical polishing (CMP) with colloidal silica to prepare a composite base substrate. The arithmetic average roughness Ra after the finishing was 0.1 nm, the amount of grinding and polishing was 50 μm, and the composite base substrate after the completion of polishing had a thickness of 1.05 mm. The surface on which the AD film is formed is hereinafter referred to as a "surface".

The surface of the composite base substrate was subjected to composition analysis with an electron probe microanalyzer (FE-EPMA) (an electron probe microanalyzer JXA-8500F manufactured by JEOL Ltd.) at a probe size of 30 μm×30 μm. The FE-EPMA measurement was performed under the measurement conditions of an accelerating voltage of 15 kV and an irradiation current of 50 nA. As a result, Cr, O, Ti, and Fe were detected. The quantitative values of the detected elements (the atomic composition percentage of the atoms excluding O) were 83.7 atomic % for Cr, 3.7 atomic % for Ti, and 12.6 atomic % for Fe.

A sample was prepared and examined in the same manner as in Example 1 except that the composite base substrate prepared as described above was used with the surface on the AD film (the α-Cr₂O₃ solid solution substrate) side facing up. The main phase of a crystal film formed on the base substrate was α-Ga₂O₃. Table 1 shows various evaluation results.

TABLE 1

| Example | Separation [1] | α—Ga₂O₃ film thickness [μm] | XRC half-width [arcsec] | | Crystal orientation difference between base substrate and α—Ga₂O₃ [degrees] | | Content of element [atoms/cm³] | | | | |
|---|---|---|---|---|---|---|---|---|---|---|---|
| | | | (006) | (104) | (0001) | (10-10) | Li | Na | K | Cr | Ni |
| 1 | OK | 31 | 1230 | 1430 | 0.38 | 0.34 | 1.5E+15 | 9.8E+16 | 4.2E+16 | 5.4E+16 | 9.4E+16 |
| 2 | OK | 25 | 1570 | 1890 | 0.25 | 0.20 | 4.7E+16 | 2.3E+15 | 4.5E+15 | 4.8E+16 | 3.1E+15 |

TABLE 1-continued

| Example | Separation [1] | $\alpha$—$Ga_2O_3$ film thickness [μm] | XRC half-width [arcsec] (006) | (104) | Crystal orientation difference between base substrate and $\alpha$—$Ga_2O_3$ [degrees] (0001) | (10-10) | Content of element [atoms/cm³] Li | Na | K | Cr | Ni |
|---|---|---|---|---|---|---|---|---|---|---|---|
| 3 | OK | 29 | 1097 | 1220 | 0.14 | 0.18 | 3.1E+15 | 5.6E+16 | 2.0E+15 | 1.2E+16 | 2.6E+16 |
| 4 | OK | 14 | 98 | 324 | 0.08 | 0.13 | 1.4E+16 | 3.9E+17 | 7.2E+17 | 2.5E+15 | 2.3E+16 |

[1] "OK" represents a separation area percentage of 10% or less. "NG" represents a separation area percentage of more than 10%.

Comparative Example 1

As described below, an $\alpha$-$Ga_2O_3$ crystal film was prepared by a mist CVD method using a square 4-mm c-plane sapphire substrate (no off-angle, treated by surface CMP) as a base substrate. An aqueous solution having a gallium acetylacetonate concentration of 0.08 mol/L and containing 1.5% by volume of 36% hydrochloric acid was used as a raw material solution. This raw solution was atomized by vibrating at 2.4 MHz with an ultrasonic transducer and was introduced into the film-forming chamber by nitrogen gas. In the film-forming chamber, the substrate was placed on a susceptor disposed therein in advance, and the chamber was heated to 490° C. The raw material solution mist was deposited in a film form by a CVD reaction on the surface of the base substrate, and such film formation was performed for 60 minutes. The film formation was repeated five times to stack crystal films on the base substrate. The main phase of the crystal films formed on the base substrate was identified as $\alpha$-$Ga_2O_3$ by XRD. In Comparative Example 1, separation of 50% or more of the films was visually observed, and many cracks were occurred around the separated portion. Thus, the film thickness was measured in cross-sectional observation of a portion without separation. Table 2 shows various evaluation results.

Comparative Example 2

An $\alpha$-$Ga_2O_3$ crystal film was prepared by the mist CVD method in the same manner as in Comparative Example 1 using the same $\alpha$-$Cr_2O_3$ substrate as in Example 1 as the base substrate. The film formation for 60 minutes was repeated 10 times, that is, for 600 minutes in total. The main phase of the crystal films formed on the base substrate was identified as $\alpha$-$Ga_2O_3$ by XRD. In Comparative Example 2, separation of 40% or more of the films was visually observed, and many cracks were occurred around the separated portion. The film thickness was measured in cross-sectional observation of a portion without separation. Table 2 shows various evaluation results.

As shown in Table 2, in Comparative Examples 1 and 2, in which the alkali metal element contents of the $\alpha$-$Ga_2O_3$ crystal film were all less than $1.2×10^{15}$ atoms/cm³, separation occurred in a wide area between the $\alpha$-$Ga_2O_3$ crystal film and the base substrate. By contrast, as shown in Table 1, in Examples 1 to 4, in which at least one alkali metal element content ranged from $1.2×10^{15}$ to $1.0×10^{18}$ atoms/cm³, the separation between the $\alpha$-$Ga_2O_3$ crystal film and the base substrate was reduced, and the separation area was 3% or less in all the examples. In Examples 1 to 4, the crystal orientation differences between the $\alpha$-$Ga_2O_3$ crystal film and the base substrate with respect to their (0001) plane and the (10-10) plane were both 0.4 degrees or less, and the X-ray rocking curve half-width was 2000 arcsec or less on both the (006) plane and the (104) plane of the $\alpha$-$Ga_2O_3$ crystal film.

In the present specification, a numerical range expressed using "to" means the range specified by the minimum and maximum values described before and after "to", respectively.

What is claimed is:

1. A composite substrate comprising:

a base substrate and an $\alpha$-$Ga_2O_3$ crystal film that is provided on the base substrate, has a thickness of 10 μm or more, and has at least one alkali metal element content of $1.2×10^{15}$ atoms/cm³ or more and $1.0×10^{18}$ atoms/cm³ or less.

2. The composite substrate according to claim 1, wherein the base substrate is an $\alpha$-$Cr_2O_3$ substrate.

3. The composite substrate according to claim 1, wherein the crystal orientation differences between the $\alpha$-$Ga_2O_3$ crystal film and the base substrate with respect to their (0001) plane and (10-10) plane are both 0.4 degrees or less.

4. The composite substrate according to claim 1, wherein the $\alpha$-$Ga_2O_3$ crystal film has an X-ray rocking curve half-width of 2000 arcsec or less on a (006) plane and a (104) plane.

TABLE 2

| Comparative example | Separation [1] | $\alpha$—$Ga_2O_3$ film thickness [μm] | XRC half-width [2] [arcsec] (006) | (104) | Crystal orientation difference between base substrate and $\alpha$—$Ga_2O_3$ [degrees] (0001) | (10-10) | Content of element [atoms/cm³] Li | Na | K | Cr | Ni |
|---|---|---|---|---|---|---|---|---|---|---|---|
| 1 | NG | 5 | — | — | — | — | <1.0E+15 | <1.0E+15 | <1.0E+15 | <1.0E+15 | <1.0E+15 |
| 2 | NG | 7 | — | — | — | — | <1.0E+15 | <1.0E+15 | <1.0E+15 | <1.0E+15 | <1.0E+15 |

[1] "OK" represents a separation area percentage of 10% or less. "NG" represents a separation area percentage of more than 10%.
[2] "—" represents unmeasured.

5. The composite substrate according to claim 1, wherein at least one of a Cr content and a Ni content of the $\alpha$-$Ga_2O_3$ crystal film is $2.0 \times 10^{15}$ atoms/$cm^3$ or more and $1.0 \times 10^{17}$ atoms/$cm^3$ or less.

6. The composite substrate according to claim 1, wherein a Li content, a Na content, and a K content of the $\alpha$-$Ga_2O_3$ crystal film are individually $1.2 \times 10^{15}$ atoms/$cm^3$ or more and $1.0 \times 10^{18}$ atoms/$cm^3$ or less.

7. A method for producing the composite substrate according to claim 1, wherein the $\alpha$-$Ga_2O_3$ crystal film is formed on a surface of the base substrate by bringing the base substrate into a super-critical state at a temperature of 390° C. or more and at a pressure of 22.1 MPa or more while the base substrate is immersed in an aqueous solution containing Ga ions.

8. The method for producing a composite substrate according to claim 7, wherein the aqueous solution contains an alkali metal element.

9. A method for producing a gallium oxide crystal film, comprising removing the base substrate from the composite substrate according to claim 1 to prepare a free-standing $\alpha$-$Ga_2O_3$ crystal film.

10. A method for producing a gallium oxide crystal film, comprising removing the base substrate from the composite substrate produced by the method for producing a composite substrate according to claim 7 to prepare a free-standing $\alpha$-$Ga_2O_3$ crystal film.

\* \* \* \* \*